United States Patent [19]

Mycynek et al.

[11] Patent Number: 5,745,004
[45] Date of Patent: Apr. 28, 1998

[54] FPLL WITH THIRD MULTIPLIER IN AN AC PATH IN THE FPLL

[75] Inventors: Victor Mycynek, Des Plaines; Gary Sgrignoli, Mt. Prospect, both of Ill.

[73] Assignee: Zenith Electronics Corporation, Glenview, Ill.

[21] Appl. No.: 678,902

[22] Filed: Jul. 12, 1996

[51] Int. Cl.⁶ .......................... H03L 7/087; H04L 27/227
[52] U.S. Cl. .......................... 329/308; 329/309; 331/1 A; 331/12; 331/23; 348/726
[58] Field of Search ........................... 31/12, 23, 1 A; 329/308, 309; 348/726, 727

[56] References Cited

U.S. PATENT DOCUMENTS 4,072,909  2/1978  Citta ............................ 331/12
4,091,410  5/1978  Citta ............................ 329/360
4,755,762  7/1988  Citta et al. .................... 329/308

*Primary Examiner*—Siegfried H. Grimm

[57] ABSTRACT

A FPLL has first second and third multipliers with the first multiplier supplying demodulated signals to a limiter and the second multiplier supplying signals to the loop filter. A VCO and phase shift circuit supply quadrature signals to the first multiplier and to the third multiplier which is relocated to an AC path in the loop to avoid the effects of offsets due to stray DC voltages and currents. The limiter output is applied to the third multiplier. The third multiplier supplies its output to the second multiplier. An integrated circuit embodiment using an exclusive OR gate as the third multiplier is also shown.

7 Claims, 4 Drawing Sheets

FIG. I
(PRIOR ART)

FPLL WITH THIRD MULTIPLIER IN AN AC PATH IN THE FPLL

BACKGROUND OF THE INVENTION AND PRIOR ART

This invention relates generally to FPLL (frequency and phase locked loop) circuits and specifically to FPLLs that are especially suitable for use in integrated circuitry.

FPLLs are well known in the art as evidenced by U.S. Pat. Nos. 4,072,909; 4,091,410 and 4,755,762, all of which are assigned to the assignee of this application and all of which are incorporated by reference herein. FPLLs are biphase stable and require some mechanism for assuring the proper polarity of demodulated output signal when, for example, they are used in television receiver circuits and the like. In the prior art, this has taken the form of determining the polarity of lock up from the FPLL output signal (or other suitable indicator) and inverting the FPLL output signal, as required, to assure a desired demodulated output signal polarity.

Difficulty is often experienced in practical FPLL circuits due to small disturbances caused by offsets from stray DC voltages and currents that tend to introduce non linearities into the system. When considering an FPLL implementation in an integrated circuit (IC) environment, any slight offset in the loop can result in unsymmetrical frequency and phase lock characteristics. In addition, these undesirable characteristics may differ between the two different phase lock up modes or conditions.

The present invention yields significant benefits in FPLL design by the simple expedient of relocating the so-called third multiplier from a DC path to an AC path. The DC, or low frequency, path processes the low frequency difference signals that are applied to the loop filter and the voltage controlled oscillator (VCO). The AC path processes the high frequency VCO signals, which in most instances, have high speed edges and are AC coupled. Removal of the third multiplier from the DC path results in more ideal performance due to lower DC offsets and non linearities. In practical implementations, it additionally results in lower power supply voltage requirements. The third multiplier in the AC path performs the function of inverting the 90° phase of the quadrature VCO signal in response to the limiter input. This environment is much more controllable since the waveforms are more uniform in size and tend to be purely digital. Presently a pre-scaler is used to provide the 0° and 90° phase outputs of the VCO. In this implementation, the third multiplier may conveniently take the form of an exclusive OR gate in the path after the 90° phase shifted VCO output from the pre-scaler. In general, the 0° and 90° phase outputs of the VCO may be produced in other ways and any type of multiplier can be used in this AC path. As those skilled in the art know, care needs to be taken to insure a delay match between the in-phase and quadrature mixer circuits to keep them orthogonal.

OBJECTS OF THE INVENTION

A principal object of the invention is to provide a novel FPLL.

Another object of the invention is to provide an FPLL of improved design that obviates problems of the prior art.

A further object of the invention is to provide an FPLL that is especially suitable for use in integrated circuits.

BRIEF DESCRIPTION OF THE DRAWING

These and other objects and advantages of the invention will be apparent upon reading the following description in conjunction with the drawings, in which.

DESCRIPTION OF THE PREFERRED EMBODIMENT

Figure 1:
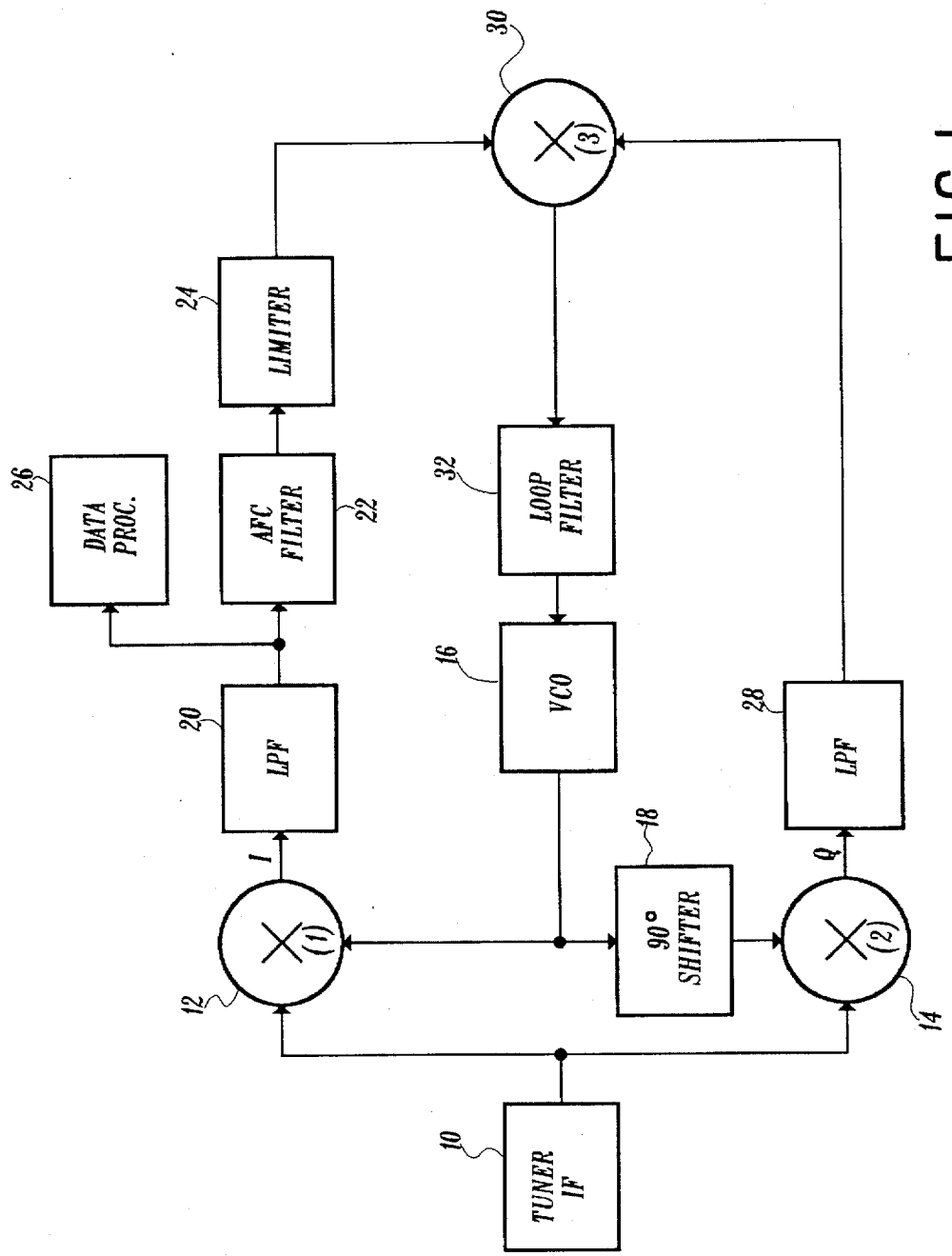
FIG. 1 is a partial block diagram of a prior are television receiver incorporating an FPLL.

FIG. 1 depicts a prior art television circuit incorporating an FPLL. A tuner-IF circuit 10 supplies an IF signal to a first and a second multiplier 12 and 14, respectively. VCO 16 supplies a demodulating signal to first multiplier 12 and to a 90° phase shift circuit 18, which supplies a phase shifted oscillator signal to second multiplier 14. The first and second multipliers 12 and 14 produce sum and difference signal outputs from their input signals and the output signals from multipliers 12 and 14 are supplied to low pass filters (LPFs) 20 and 28, respectively. The output of LPF 20 is supplied to an AFC filter 22, which in turn supplies its output signal to a limiter 24. Limiter 24 is coupled to one input of a third multiplier 30. The output of the LPF 28 supplies the second input of multiplier 30, which multiplies its two input signals and produces an output signal that is supplied to a loop filter 32, the output of which controls VCO 16. A data processor 26 receives the demodulated input signal from LPF 20. In the usual television implementation, data processor 26 is a video processor and functions to reproduce the televised signal.

As fully explained in the above-mentioned patents and as shown in FIG. 1, frequency acquisition of the input signal is accomplished by the action of the average DC error voltage generated at the output of third multiplier 30. This average DC error voltage results from the multiplication of the beat note frequencies generated in the Q channel path (via LPF 28) and the I channel path through the phase shifting AFC filter 22 and limiter 24. At the point of frequency acquisition, the beat note frequencies are sufficiently close to 0 Hz such that phase lock can occur. When phase lock is attained, the beat note output of limiter 24 becomes a fixed DC voltage (+ or −1), thus effectively removing the frequency acquisition function, and the loop reduces to a simple PLL. Because the polarity of the output of limiter 24 determines the phase of the PLL lock up, the loop is biphase stable.

Those skilled in the art will appreciate that the third multiplier 30 is in a portion of the circuit that is affected by DC currents, due to offsets and the like. For example, in a vestigial sideband (VSB) digital transmission system, a very small pilot carrier is used for frequency and phase lock purposes. Because the pilot portion of the signal is very small, even small unwanted DC offsets, due to the presence of the third multiplier, will cause offsets and unsymmetrical frequency and phase lock characteristics and degrade the signal being demodulated in the I channel.

Figure 2:
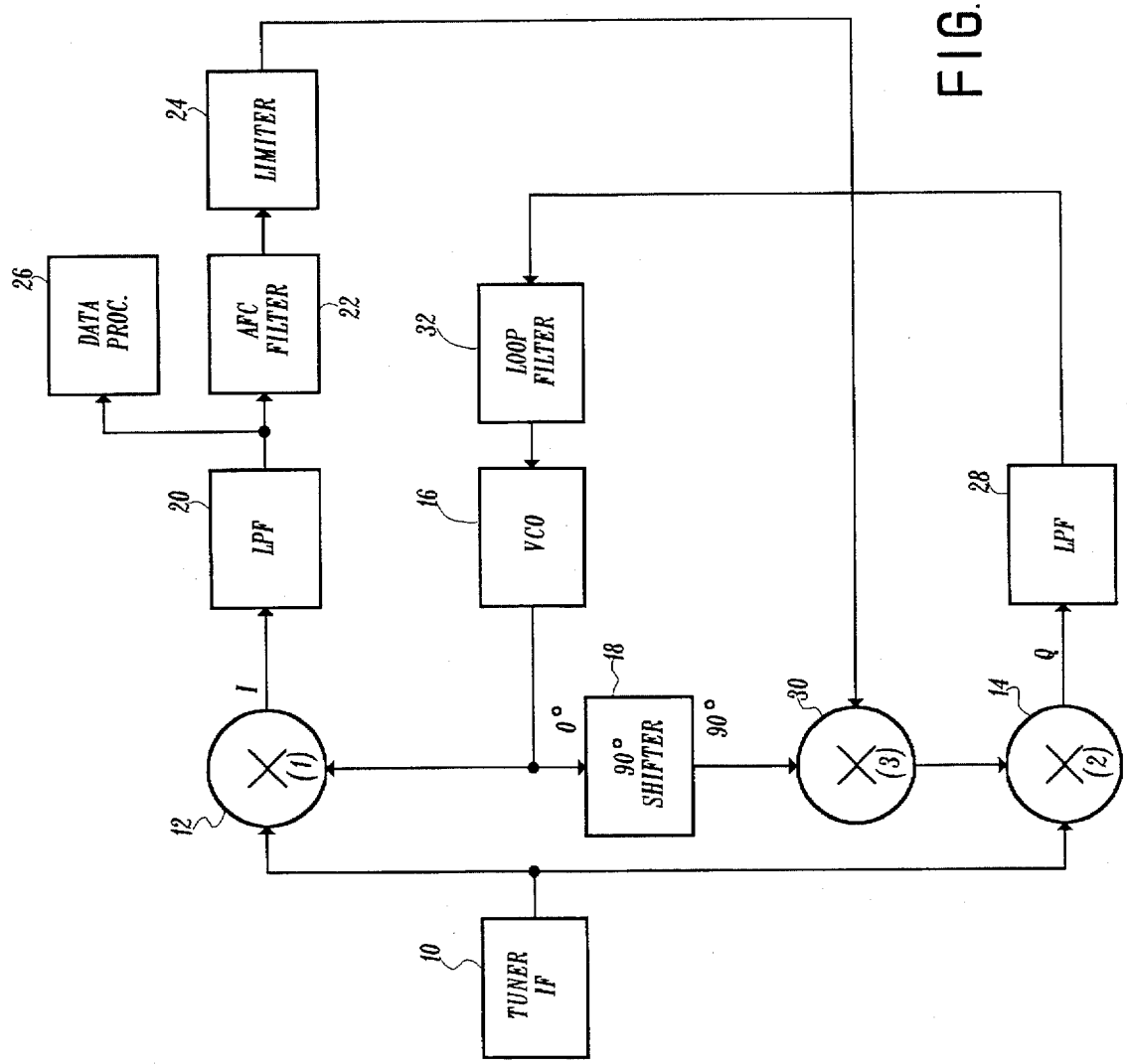
FIG. 2 is a partial block diagram of a television receiver incorporating an FPLL constructed in accordance with the invention.

In the arrangement of FIG. 2, the third multiplier 30 is relocated to the AC or high frequency portion of the circuit. In this position, only well-controlled signals from the 90° phase shifter 18 and the limiter 24 are applied to multiplier 30. In some cases, the output of the 90° phase shifter circuit 18 may also be AC coupled and/or limited to further minimize DC and timing offsets. The function of the third multiplier 30, now becomes one of generating a 0° or 180° phase shifted version of the output of 90° phase shifter 18, that is plus and minus 90° in response to the polarity of limiter 24. In this arrangement, the difficulties of the prior art are avoided and the design lends itself especially well to an integrated circuit implementation. The output of the third multiplier 30 and the output of tuner IF 10 now feeds the second multiplier 14 and the output of second multiplier 14 is coupled through LPF 28 and loop filter 32 to VCO 16. Theoretical behavior of the FPLL in FIG. 2 is quite similar to that of FIG. 1, because the multiplication process through multiplier 30 and multiplier 14 is commutative, with LPF 28 not affecting the DC and low frequency difference components associated with the operation of the FPLL.

Figure 3:
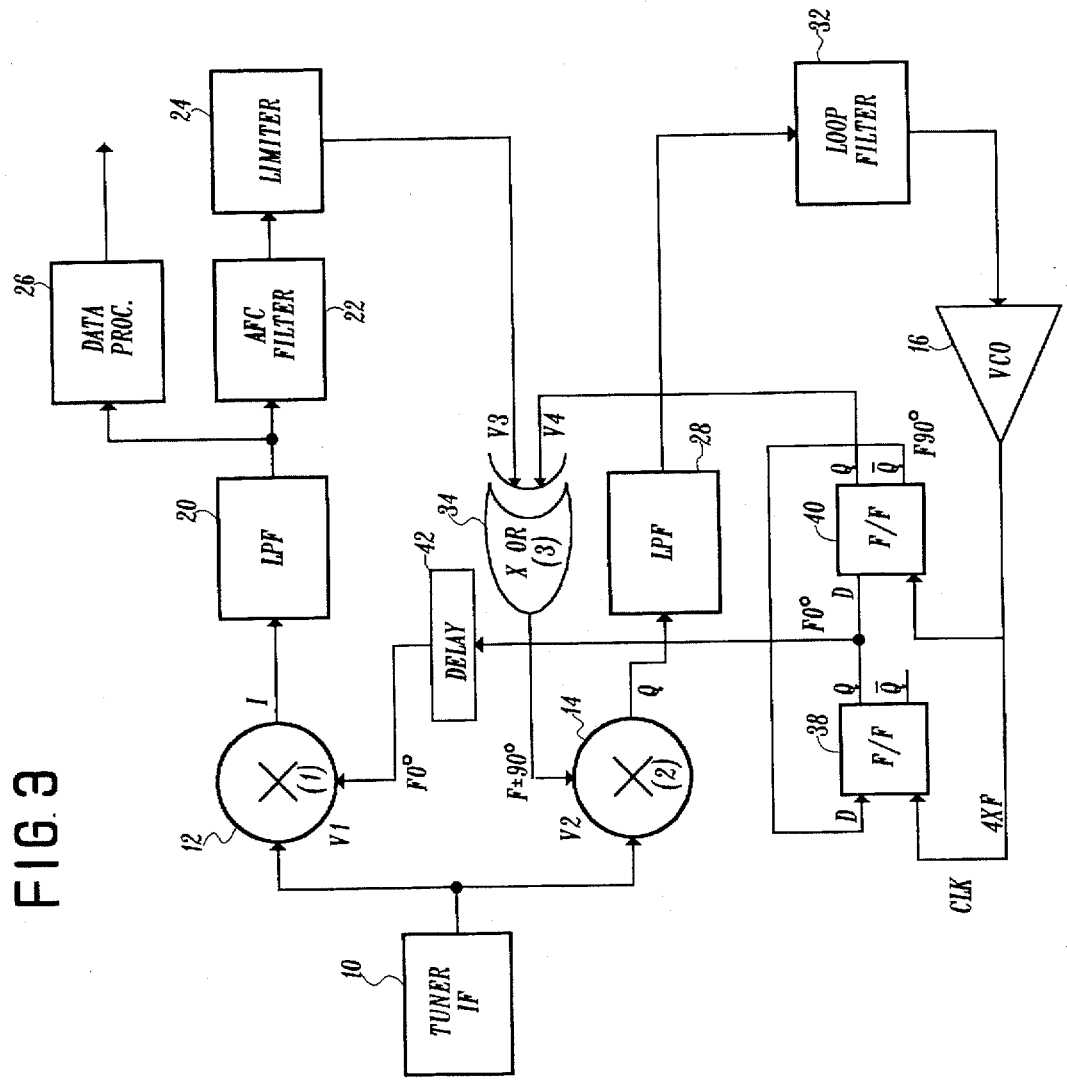
FIG. 3 is a partial schematic diagram illustrating an integrated circuit implementation of the inventive FPLL.

FIG. 3 is a functional block diagram of an integrated circuit form of the invention. Assuming a digital implementation, the third multiplier 30 is replaced by an exclusive OR (XOR) gate 34. The nominal frequency of VCO 16 is 186 MHz and a prescaler, in the form of a ring counter comprising two D flip/flops 38 and 40, is used to divide the frequency by four. This technique is known in the art. A delay 42 is incorporated in the 0° path to first multiplier 12 to compensate for the delay introduced to the 90° path by the XOR 34. The 90° output of flip/flop 40 is applied to XOR 34 along with the output of limiter 24, and depending upon the polarity of the limiter output, a plus or a minus 90° divided down VCO signal is applied to second multiplier 14.

Figure 4:
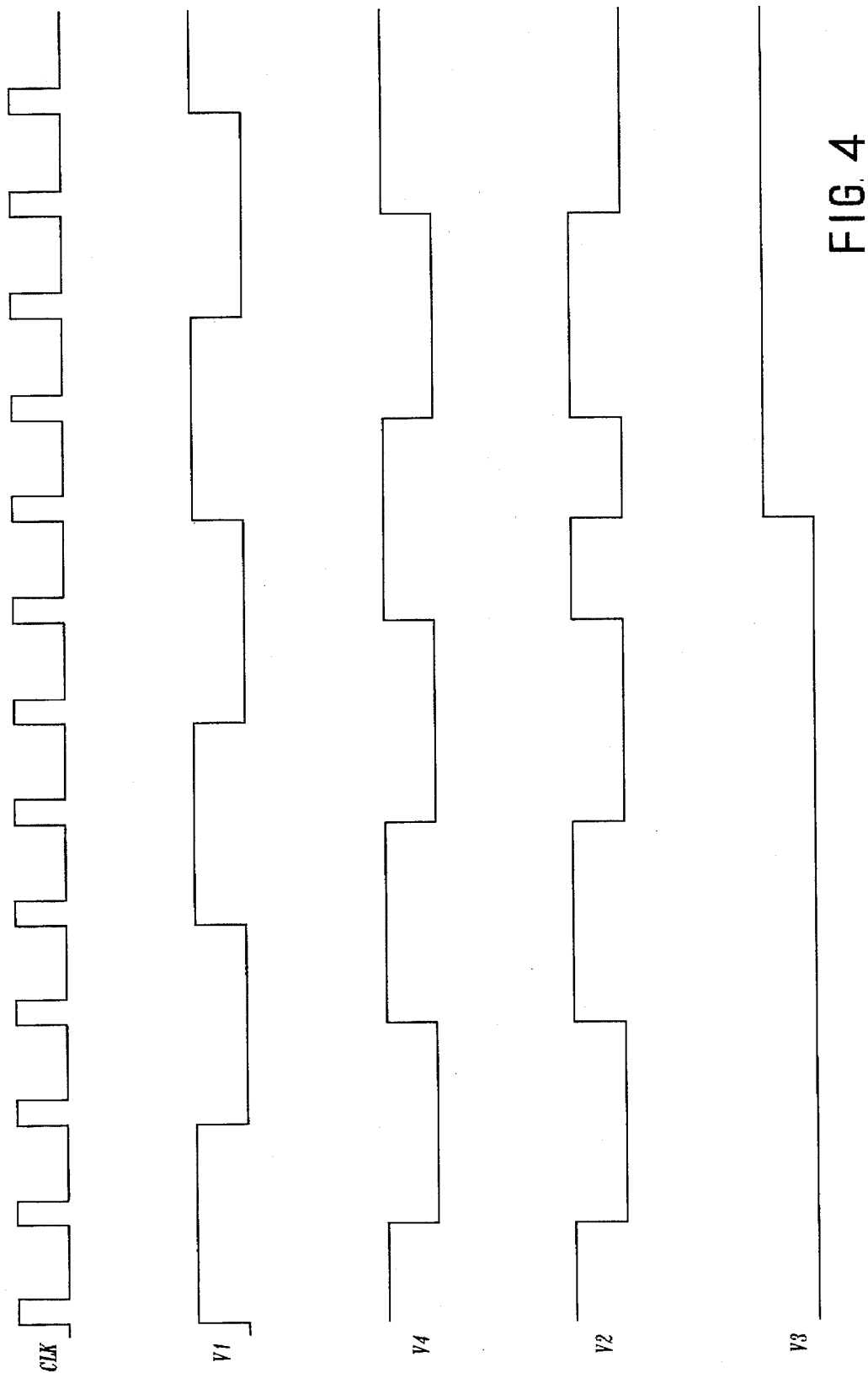
FIG. 4 is a series of waveforms related to the implementation of the FPLL in FIG. 3.

The waveforms of FIG. 4 illustrate the development of the 90° phase displaced, divided down outputs from VCO 16. As noted on FIG. 3, clock is the VCO output, V1 and V4 the 0° and 90° divided down outputs, respectively and V3 is the output from limiter 24. The voltage V2 is the output of XOR 34 and shows the phase inversion that results from a change in polarity of V3. The voltages V1 and V4 are developed on the rising edge of the clock, which obviates problems due to an oscillator duty cycle that departs from fifty percent. The circuits of FIGS. 2 and 3 have been analyzed and found to perform exactly as that of FIG. 1 in frequency acquisition and phase lock up.

What has been described is a novel FPLL that solves the above-mentioned problems of the prior art and that is especially adapted for use in integrated circuitry. It is recognized that numerous changes in the described embodiment of the invention will occur to those skilled in the art without departing from its true spirit and scope. The invention is to be limited only as defined in the claims.

What is claimed is:

1. A bisphase stable FPLL comprising:
   means providing an input signal;
   a first and a second multiplier connected for receiving said input signal;
   means, including a VCO, for developing two 90° phase displaced demodulation signals;
   a third multiplier;
   means for supplying one of said 90° phase displaced signals to said first multiplier and the other of said 90° phase displaced signals to said third multiplier;
   means for supplying the output of said third multiplier to said second multiplier:
   limiter means coupling the output of said first multiplier to said third multiplier; and
   a loop filter coupling the output of said second multiplier to said VCO.

2. The FPLL of claim 1, wherein said signal supplying means includes a circuit chip having a prescaler and a 90° phase shift circuit;
   said third multiplier being included in said circuit chip.

3. The FPLL of claim 2, wherein said third multiplier comprises an exclusive OR gate.

4. The FPLL of claim 3, wherein said prescaler and said 90° phase shift circuit together comprise a pair of D flip/flops, connected as a ring counter, and a delay circuit.

5. In an FPLL of the type including first, second and third multipliers, VCO means for supplying a pair of 90° phase displaced signals for demodulating an input signal, an AFC filter and limiter coupled between the first multiplier and the third multiplier, with the third multiplier being in a DC path in the FPLL and subject to offsets due to signal and noise, the improvement comprising:
   relocating the third multiplier to an AC path in the FPLL.

6. The FPLL of claim 5, wherein a 90° phase shift circuit is included for supplying the phase displaced signals to the first and second multipliers, the improvement further comprising:
   interposing said third multiplier between said phase shift circuit and said second multiplier and coupling the output of said second multiplier to said VCO means.

7. The FPLL of claim 6, wherein said third multiplier comprises an exclusive OR gate.

* * * * *